United States Patent [19]

Samata et al.

[11] Patent Number: 5,004,702

[45] Date of Patent: Apr. 2, 1991

[54] PREPARATION METHOD OF SELECTIVE GROWTH SILICON LAYER DOPED WITH IMPURITIES

[75] Inventors: Shuichi Samata; Yoshiaki Matsushita, both of Yokohama, Japan

[73] Assignee: Kabushiki Kaisha Toshiba, Kawasaki, Japan

[21] Appl. No.: 338,794

[22] Filed: Apr. 17, 1989

[30] Foreign Application Priority Data

Oct. 19, 1987 [JP] Japan .................. 62-263128

[51] Int. Cl.$^5$ ........................... H01L 21/225
[52] U.S. Cl. ..................... 437/57; 437/152; 437/160
[58] Field of Search ............ 437/89, 160, 57; 502/152

[56] References Cited

U.S. PATENT DOCUMENTS

| 3,700,507 | 10/1972 | Murray | 437/152 |
| 4,412,868 | 11/1983 | Brown et al. | 437/89 |
| 4,714,686 | 12/1987 | Sander et al. | 437/195 |

FOREIGN PATENT DOCUMENTS 0228183  7/1987  European Pat. Off.
3636547 A1  4/1987  Fed. Rep. of Germany
62-29024  12/1987  Japan

OTHER PUBLICATIONS

"Metallization for ULSI," Hideo Kotani, Extended Abtracts of the 20th (1988 Int'l) Conference on Solid State Devices and Materials, Tokyo, 1988, pp. 565-568.
"Fabrication of Low-Resistance Polysilicon Via Plugs in Borophosphosilicate Glass," Raley et al., Journal of the Electrochemical Society, vol. 135, No. 10, Oct. 1988, pp. 2640-643.
A. Ipri et al., "Selective Epitaxial Growth for the Fabrication of CMOS Integrated Circuits," IEEE Transactions on Election Devices, vol. ED-31, No. 12, Dec. 1984.
H. Shibata et al., "High Performance Half-Micron PMOSETs with 0.1 μm Shallows P+N Junction Utilizing Selective Silicon Growth and Rapid Thermal Annealing," Proceeding of the IEDM (1987).

Primary Examiner—Olik Chaudhuri
Assistant Examiner—George R. Fourson
Attorney, Agent, or Firm—Finnegan, Henderson, Farabow, Garrett and Dunner

[57] ABSTRACT

A semiconductor substrate having a surface region of P type and a surface region of N type is formed, then an insulating membrane is formed on the semiconductor substrate. The first contact hole which is formed in said region of P type and the second contact hole which is connected to said region of N type are formed by the same process as that for said insulating membrane. Non-doped silicon layer is grown in said first and second contact holes by the same selective growth process, in a single reactive furnace. A diffusion source layer containing impurities of P type is formed on said first contact hole and a diffusion source layer containing impurities of N type on said second contact hole. Impurities are diffused from said diffusion layers to said silicon layers, and said diffusion source layer is then removed. A metal wire layer is formed by connecting it to said silicon layer.

7 Claims, 3 Drawing Sheets

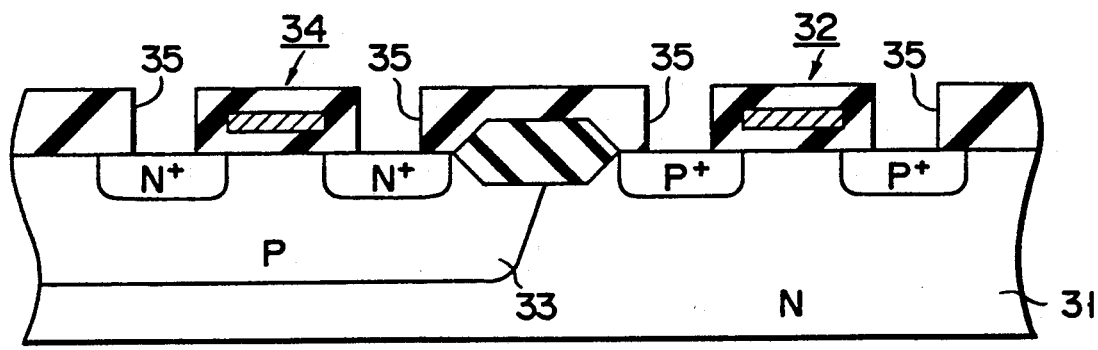
F I G. 4A
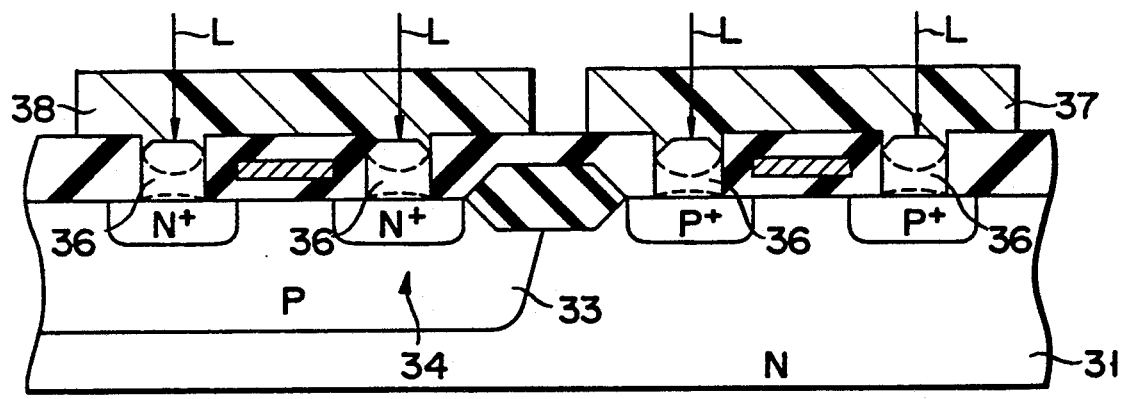
F I G. 4B

PREPARATION METHOD OF SELECTIVE GROWTH SILICON LAYER DOPED WITH IMPURITIES

BACKGROUND OF THE INVENTION

1. Field of the Invention

This invention relates to a method of manufacturing a semiconductor device, specifically a doping method of doping impurities into a selective growth silicon layer.

2. Description of the Related Art

A selective growth process is utilized as an effective process for separating fine elements and for manufacturing a contact filling (including, for example, a self-aligning contact).

A conventional example utilizing a selective growth process applied to the contact filling technique is described in reference to FIG. 1. An insulating layer 2 having an opening is formed on semiconductor substrate 1. The resultant structure is provided on a susceptor 5 in a reactive furnace 4 (a reactive chamber) for epitaxial growth. For example, by utilizing $H_2$ as a carrier gas and silicon chloride or hydrogenated silicon as a material gas, and adding HCl gas and doping gas (gaseous compounds containing impurity atoms in reactive gas), a gas growth process is conducted under reduced pressure. Consequently, silicon layer 3 containing impurities is grown in said opening.

In said conventional method, the impurity atoms adhere to the inner surfaces of the reactive furnace 4 and the susceptor 5 during the growth of silicon layer 3. The adhered impurity atoms float again in the next selective growth process, and contaminate the next growing silicon layer Therefore, in order to selectively grow a silicon layer containing P type impurities and a silicon layer containing N type impurities, both a reactive furnace for p type and for N type impurities are needed, which doubles facility costs. Therefore, a technique is desired, to obtain selective growth of silicon layers doped with P type impurities and those doped with N type impurities, by utilizing a single reactive furnace for epitaxial growth.

Although a technique is produced to dope impurities in a selective growth silicon layer by implanting ions therein, this technique adversely suffers from the reciprocal relation that a large implantation dose cannot result in a deep implantation, while a deep implantation cannot result in a large implantation dose. As a result it is very difficult to obtain a selective growth silicon layer, whose impurity concentration and depth are both large, by utilizing an ion implantation process.

SUMMARY OF THE INVENTION

The object of the present invention is to provide a method for manufacturing semiconductor devices in which both of P type selective growth silicon layers and N type selective growth silicon layers can be formed, by means of a single reactive furnace for a selective growth.

In order to attain the above object, a method for forming semiconductor devices has steps of:

preparing a semiconductor substrate (31) having a region of a first conductivity type and a region of a second conductivity type;

forming an insulating film on the semiconductor substrate (31);

forming the first opening and the second opening in the insulating membrane, the first opening being connected to the region of the first conductivity type, and the second opening being connected to the region of the second conductivity type, and the first and second openings being substantially formed by the same process;

selectively growing the first semiconductor layer in the first openings (35) and the second semiconductor layer in the second openings (35), the first semiconductor layer and the second semiconductor layer being substantially formed by the same process;

forming the first diffusion source layer (37) of the first conductivity type on said first semiconductor layer, and the second diffusion source layer (38) containing impurities of the second conductivity type on said second semiconductor layer;

diffusing impurities in the first semiconductor layer (36) and the second semiconductor layer (36) by utilizing the first and second diffusion source layers (37, 38) as solid diffusion sources; and removing the first and said second diffusion source layers (37, 38).

According to the above-identified method, although the final conductivity types of said first semiconductor layer and said second semiconductor layer are different from each other, only a single reactive furnace for selective growth is required. Process costs are accordingly reduced and, since the formation of contact holes which require high mask alignment accuracy is conducted in only one process, for example, the total process is simplified. Although formation of said semiconductor layer which is at least 0.4 $\mu$m in thickness and at least $10^{20}$ cm/$^3$ in its impurity concentration is conventionally difficult, it is easily obtained in the present invention. Therefore, this invention is particularly useful when both P type and N type selective growth semiconductor layers are formed which are at least 0.4 $\mu$m in thickness and at least $10^{20}$ cm$^{-3}$ in their impurity concentration.

BRIEF DESCRIPTION OF THE DRAWINGS

FIGS. 4A and 4B are sectional views showing a process for forming a CMOS transistor of the third embodiment of the present invention.

DETAILED DESCRIPTION OF THE PREFERRED EMBODIMENTS

Figure 1:
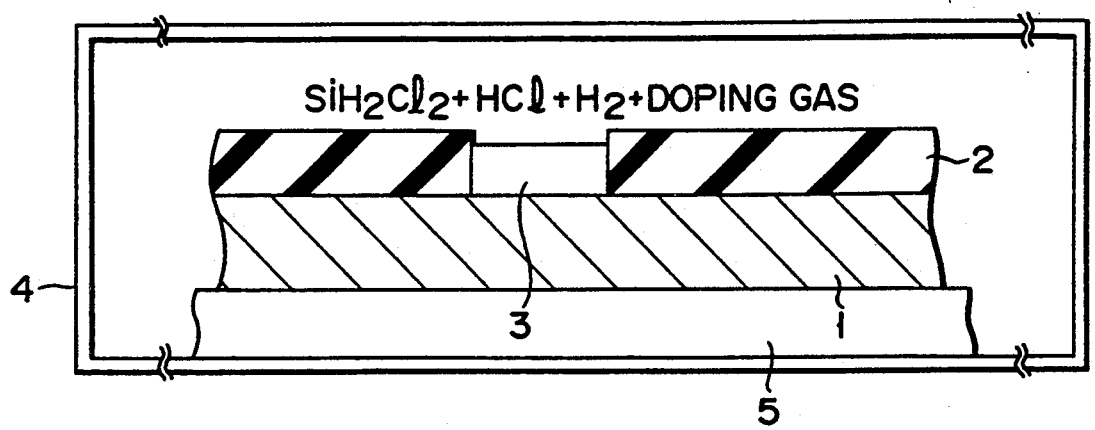
FIG. 1 is a sectional view showing a conventional process for forming a contact filling.

Descriptions of the first and second embodiments are as follows with reference to FIGS. 2A-2D.

The first embodiment shows formation of a selective growth silicon layer doped with N type impurities, and the second embodiment shows formation of a selective growth silicon layer doped with P type impurities.

The first embodiment: a P type silicon substrate (100) 11 whose specific resistance is for example 10 $\Omega$m is prepared. As ions are implanted into the substrate 11 to form diffusion layer 12 of N type whose impurity concentration is about $1 \times 10^{20}$ cm$^{-3}$, SiO$_2$ layer 13 of 600 nm in thickness is formed by steam oxidation for 3 hours. Next, opening 14 is formed in the SiO$_2$ layer by means of the usual photoetching process (PEP). As a result, such a construction is formed as shown in FIG. 2A.

Figure 2A:
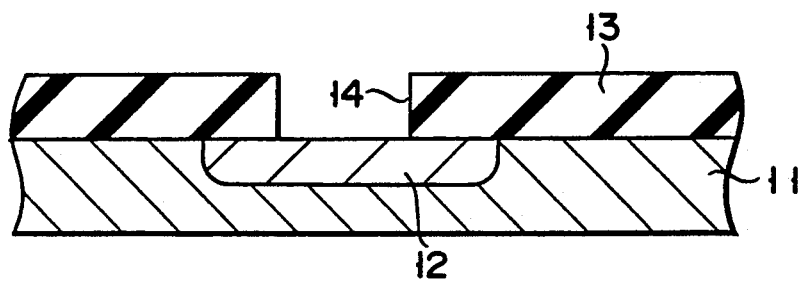
FIGS. 2A-2D are sectional views showing contact filling formation processes according to the first and second embodiments of the present invention.
Figure 2B:
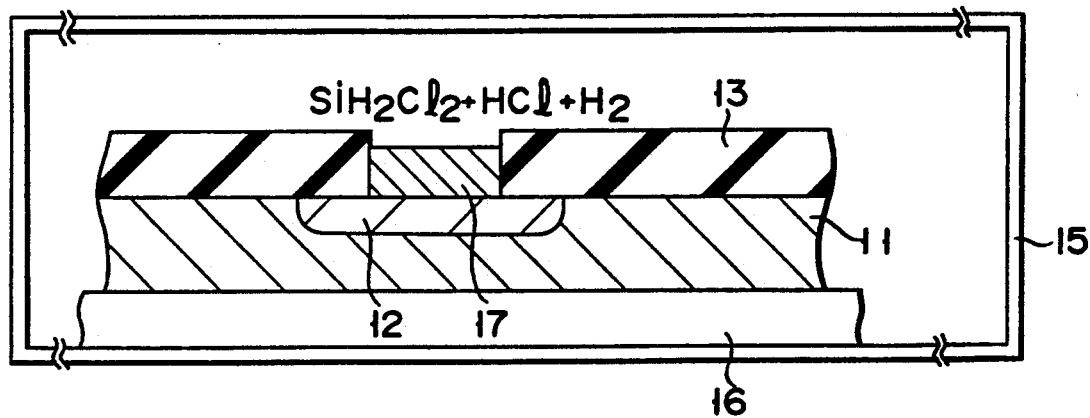

A construction of FIG. 2A is mounted on susceptor 16 in the reactive furnace (reactive chamber) for an epitaxial growth. By utilizing $SiH_2Cl_2 + HCl + H_2$ gas and in an atmosphere of about 100 torr, non-doped silicon selective growth is conducted at 900° C. Consequently as shown in FIG. 2B, a non-doped silicon layer 17 (single-crystal silicon and/or polysilicon) of about 600 nm in thickness is formed in the opening 14.

Figure 2C:
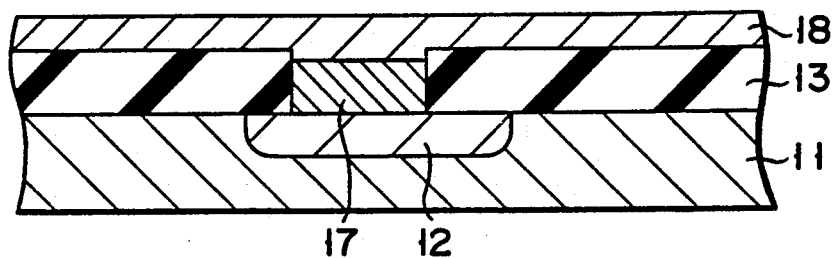

As shown in FIG. 2C, PSG layer 18 which contains N type impurities of about $5 \times 10^{20} \sim 1 \times 10^{21}$ cm$^{-3}$ is formed on the silicon layer 17. The resultant structure is heated in an $O_2$ atmosphere at 900° C. for 30 minutes, and N type impurities are diffused from the PSG layer 18 into the silicon layer 17. At the same time, impurities are also diffused from the impurity layer 12 into the selective growth silicon layer 17 so that, consequently, selective growth silicon layer 17 doped with N type impurities is formed. Next, PSG layer 18 is removed to form aluminum wiring 20. As a result, a contact filling is formed by utilizing selective growth silicon layer 17 doped with N type impurities.

The second embodiment: a N type silicon substrate (100) 11 whose specific resistance is 10 $\Omega$m is formed. P type diffusion layer 12 is formed on the surface of the N type silicon substrate 11 by implanting $BF_2$ ions in the substrate 11, then steam oxidation is conducted for 3 hours to form $SiO_2$ layer 13, of 600 nm thickness, and the photoetching process is implemented to form opening 14 therein. Next, non-doped silicon layer is selectively grown at 900° C. by utilizing $SiH_2Cl_2 + HCl + H_2$ gas. Consequently, non-doped silicon layer 17 of about 600 nm thickness is formed in the opening 14 as shown in FIG. 2B.

Figure 2D:
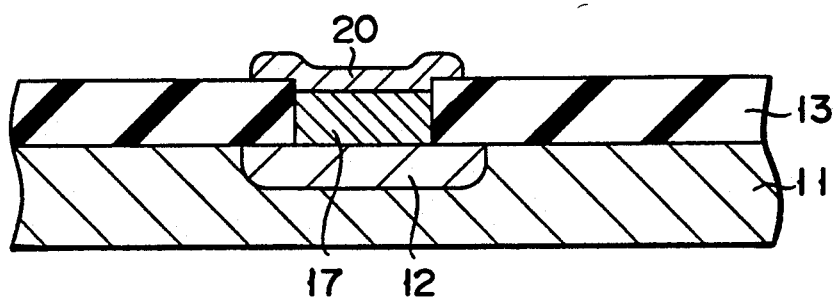

As shown in FIG. 2C, BSG layer 18 is formed in the non-doped silicon layer 17. The resultant structure is heated in an $O_2$ atmosphere at 900° C. for 30 minutes to diffuse P type impurities from the BSG layer 18 into the non-doped silicon layer 17. At the same time, P type impurities are also diffused from the impurity layer 12 into the silicon layer 17. Therefore, selective growth silicon layer 17 doped with P type impurities is formed. The BSG layer 18 is removed to form aluminium wiring 20. As a result, a contact-hole filling is formed by utilizing selective growth silicon layer 17 doped with N type impurities as shown in FIG. 2D.

According to said method for doping impurities into a selective growth silicon layer, only one reactive furnace for epitaxial growth is needed, irrespective of the type of final requisite silicon layer, i.e., P type, N type or non-doped. Moreover, since the depth of the PSG layer or BSG layer 18 and the impurity concentration contained therein can be arbitrarily set, this invention can be applied to a silicon layer 17 which has both a high impurity concentration and substantial depth. Also, since the selective growth gas includes no doping gas, the silicon layer growth shows stability and good reproductivity. (When the amount of doping gas is large, the selectivity silicon growth decreases, therefore, a silicon layer may be deposited on the $SiO_2$ layer 13, and the reproductivity of the growth rate decreases, which eventually leads to serviceability deterioration.)

Figure 3:
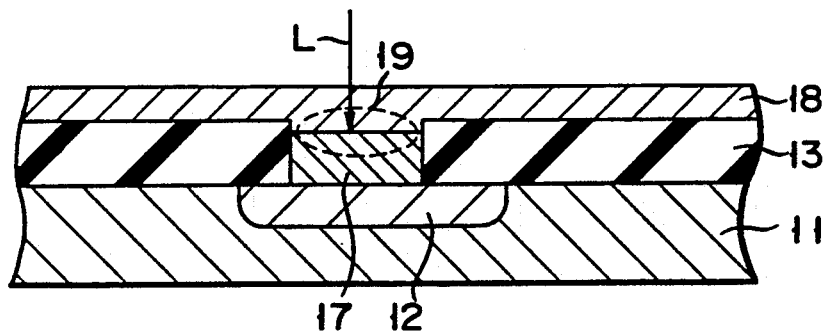
FIG. 3 is a sectional view showing a modified example of said first and second embodiments of the present invention.

In said first and second embodiments, impurities are doped into the selective growth silicon layer 17 in an $O_2$ atmosphere at 900° C. for 30 minutes. However, as shown in FIG. 3, boundaries between the layer 17 and the layer 18 and its peripheral area (an area surrounded with broken lines in FIG. 3) may be irradiated by light, e.g. laser light L within 10 minutes, for example, for 2 minutes and partly heated at 800°-1200° C., to form diffusion impurities in the silicon layer 17 (rapid anneal).

In order to confirm effects obtained from the methods with reference to said first and second embodiments, semiconductor devices of the same construction were respectively produced according to said first embodiment, second embodiment, first conventional example, and second conventional example both of which are described as follows, and their features are verified. The features verified are contact characteristics between silicon layer 17 and Al wiring 20, and impurity concentration distribution in selective growth silicon layer 17, assayed by secondary ion mass spectrometric analysis.

The first conventional example: Instead of post selective growth processes according to said first embodiment, P doping selective growth is conducted by utilizing $SiH_2Cl_2 + HCl + PH_3 + H_2$ gas. Si layer 17 is then formed, and Al wire 20 is formed.

The second conventional example: Instead of post selective growth processes according to said second conventional embodiment, $SiH_2Cl_2 + HCl + B_2H_6 + H_2$ gas is utilized to give N doping selective growth. Si layer 17 is then formed, and Al wire 20 is formed.

As a result of comparison, contact characteristics between silicon layer 17 and aluminium wiring layer 20 were found to be almost equal in both the embodiments and conventional examples.

Also, it was found that both the embodiments and conventional examples can realize about $1 \times 10^{20}$ cm$^{-3}$ (peak value). Therefore, contact filling having sufficiently good characteristics can be obtained from both the conventional examples and the embodiments, with the exception that the selective silicon layer growth is heavily unstable and reproductivity is poor in the conventional examples. For example, since silicon is deposited on $SiO_2$ layer 13 in some cases, and the growth rate is different for each deposition sequence, the yield of the selective growth silicon layer is low. In conclusion, conventional examples are not practical. Moreover, since the first and second conventional examples implement doping of impurities during selective growth, two reactive furnaces are needed for both P type and N type impurities, while embodiments of the present invention necessitate only a single reactive furnace for selective growth. Although the embodiments need several processes after selective growth, introduction of only a single reactive furnace reduces conventional process costs to about less than 60%.

Moreover, in the semiconductor device obtained by the first and second conventional methods, impurities are diffused from the selective growth silicon layer 17 to the substrate 11 through the diffusion layer 12 during the growth of silicon layer 17. Therefore, a shallow junction is difficult to obtain. By contrast, in said first and second embodiments, the impurities of the non-doped or low-concentration doped selective growth silicon layer 17 do not diffuse into the substrate 11, resulting in a shallow junction. In the embodiments which utilize rapid anneal, a shallow junction, whose depth is at least 70% of that in the conventional examples is obtained.

Next, the third embodiment is described with reference to FIG. 4A and FIG. 4B.

P channel MOS transistor 32 is formed on N type substrate 31, and N channel MOS transistor 34 is formed in P type well 33 which is formed on the substrate 31.

Contact holes 35 are formed on source regions and drain regions, thus forming the construction shown in FIG. 4A.

The resultant structure is mounted in a reactive furnace, and silicon layers 36 are selectively grown in all contact holes 35. On the P channel MOS transistor, BSG layer 37 is formed containing P type impurities. On the N channel MOS transistor, PSG layer 38 containing N type impurities is formed by a process which is different from that for BSG layer 37. Boundaries between the silicon layer 36 and the BSG layer 37 and between the silicon layer 36 and the PSG layer 38 and those peripheral regions, are irradiated with laser light L and partly heated. Referring to the result as shown in FIG. 4B, broken lines typically indicate that impurities are diffused into the silicon layer 36 not only from the BSG layer 37 and the PSG layer 38, but also from the source regions and the drain regions.

Next, BSG layer 37 and PSG layer 38 are removed, followed by formation of metal (e.g., aluminium) wiring which is connected to the silicon layer 36.

In this manufacturing method of a CMOS semiconductor, formation of selective growth silicon layer 36 needs only a single reactive furnace for selective growth. As stated above, manufacture costs can be duly reduced.

In this manufacturing method of a CMOS transistor, additional processes are needed to form layers 37 and 38 in comparison with the conventional preparation method of a CMOS transistor. However, formation of layers 37 and 38 allows relatively rough mask alignment, for example, a mask alignment accuracy of about 1 $\mu$m is sufficient, in contrast to the formation of 1.0 $\mu$m contact holes, which necessitate highest mask alignment accuracy in manufacturing a transistor, for example, mask alignment of about 0.2 $\mu$m accuracy is needed. This embodiment allows formation of all contact holes by means of only one mask alignment process, and the total processes can be accordingly simplified, in comparison with a conventional preparation method of a CMOS transistor which necessitates two mask alignment processes, one for formation of the contact holes for P type silicon layer, and another for formation of the contact holes for N type silicon layer.

In a procedure of selectively growing a silicon layer under the condition that the silicon layer is doped, in-situ, with impurity concentration of more than $10^{20}$ cm$^{-3}$, the concentration of doping gas must increase, and the growth condition such as selectivity become less stable. Therefore, silicon is adversely deposited not only in the inner area of openings (contact holes), but also in other regions, for example, on an insulating membrane, which leads to deteriorated stability and reproductivity. Contrarily, since a silicon layer of non-doping or of low doping is formed in the present invention, stability and good reproductivity are obtained. The present invention is thus eminently useful for formation of a selective growth silicon layer containing impurities of more than $10^{20}$ cm$^{-3}$ concentration. Moreover, ion implantation in a non-doped selective growth silicon layer shows a reciprocal relation between implantation dose and implantation depth, and it is therefore difficult to form a layer containing impurities of more than $10^{20}$ cm$^{-3}$ such that the layer has a constant depth. For example, an implantation dose of about $1 \times 10^{15}$ – $1 \times 10^{16}$/cm$^2$ is needed to obtain an impurity concentration of about $10^{20}$ cm$^{-3}$ by means of ion implantation. To ensure the implantation dose, accelerated voltage must usually be about 60 keV or less. If the accelerated voltage is about 60 keV, Rp of implantation depth is at most 0.2 $\mu$m, depending on the atom species implanted. Therefore, the doping silicon layer which is formed by ion implantation is at most 0.4 $\mu$m in depth, even if it is considered that the ion implanted is diffused by heating after ion implantation, and that impurities in the semiconductor substrate are diffused into the selective growth silicon layer. The present invention sets no restrictions in implanted impurity concentration and silicon layer depth. From the above considerations, this invention is found to be eminently effective for the formation of the selective growth silicon layer which is more than 0.4 $\mu$m in depth, is more than $10^{20}$ cm$^{-3}$ in impurity concentration, and is doped with both P type and N type impurities.

Although said descriptions of the embodiments show selective growth of a silicon layer, this invention is not restricted to silicon and can be applied to, for example, selective growth of a chemical semiconductor, such as GaAs.

Although said descriptions of the embodiments show selective growth of silicon layers 17 and 36 of non-doping, this invention is not restricted to this nondoped selective growth and can be applied to formation of a selective growth silicon layer doped with impurities of relatively low concentration, for example, under $1 \times 10^{18}$ cm$^{-3}$, followed by doping of high concentration utilizing, for example, a diffusion source as described in the embodiments. The material of the diffusion source is not limited to the SiO$_2$ layer. It can be amorphous silicon layer, poly-silicon, or silicon nitride.

What is claimed is:

1. A method of forming a contact filling of a CMOS transistor in a single reactive furnace chamber, comprising the steps of:

providing a semiconductor substrate of a first conductivity type;

forming a source region of a second conductivity type and a drain region of the second conductivity type of a MOS transistor of the second conductivity type in said semiconductor substrate, and forming a source region of the first conductivity type and a drain region of the first conductivity type of a MOS transistor of the first conductivity type on a well region of the second conductivity type of said semiconductor substrate;

forming an insulating layer on said semiconductor substrate over both said regions of said first and second conductivity type;

forming a plurality of contact holes with a first positioning accuracy in said insulating layer wherein each of said plurality of contact holes exposes a corresponding source region or drain region;

placing said substrate in the reactive furnace chamber;

selectively growing a non-doped silicon layer of at least 0.4 $\mu$m depth as an electrode in each said contact hole to form a plurality of Si layers;

removing said substrate from the reactive furnace chamber;

forming a first diffusion source layer containing impurities of the first conductivity type above said MOS transistor of the first conductivity type with a lower positioning accuracy than said first positioning accuracy, such that the first diffusion source layer is connected to a first group of said plurality of silicon layers, and forming a second diffusion source layer containing impurities of the second conductivity type above said MOS transistor of the second conductivity type with a lower positioning accuracy than said first positioning accuracy, such that the second diffusion source layer is connected to a second group of said plurality of silicon layers;

diffusing impurities into said first group of silicon layers from said first diffusion source layer and said source and drain regions of the first conductivity type, and diffusing impurities into said second group of silicon layers from said second diffusion source layer and said source region of the second conductivity type, such that peak impurity concentrations are at least $1 \times 10^{20}$ cm$^{-3}$;

removing said first diffusion source layer and said second diffusion source layer; and forming metal wire layers connected to said silicon layers.

2. A method according to claim 1, wherein the step of diffusion of impurities includes a step of rapid annealing at 800° C. to 1200° C. within 10 minutes of forming said first and second solid diffusion source layers on said silicon layers.

3. A method of manufacturing a semiconductor device in a single reactive furnace chamber comprising the steps of:

providing a semiconductor substrate having a region of the first conductivity type and a region of the second conductivity type;

forming an insulating film on said semiconductor substrate;

forming a first opening and a second opening in said insulating film, said first opening being connected to said region of the first conductivity type, and said second opening being connected to said region of the second conductivity type;

placing said substrate in the reactive furnace chamber;

selectively growing a first semiconductor layer in said first opening and a second semiconductor layer in said second opening;

removing said substrate from the reactive furnace chamber; and forming a first diffusion source layer containing impurities of the first conductivity type on said first semiconductor layer, and a second diffusion source layer containing impurities of the second conductivity type on said second semiconductor layer;

diffusing impurities to said first semiconductor layer from said first diffusion source layer, and diffusing impurities to said second semiconductor layer from said second diffusion source layer; and removing said first diffusion source layer and said second diffusion source layer.

4. A method according to claim 3, wherein said step of forming said first opening and said second opening includes forming said first opening and said second opening with a first positioning accuracy; and said step of forming said first and second diffusion source layers includes forming said first and second diffusion source layers with a positioning accuracy less than said first positioning accuracy of said step of forming said first and second opening.

5. A method according to claim 3, wherein said step of growing said first and second semiconductor layers includes forming said first and second semiconductor layers to a thickness of at least 0.4 μm by utilizing a selective growth process, and said step of diffusing impurities into said first and second semiconductor layer is such that the peak impurity concentration is at least $1 \times 10^{20}$ cm$^{-3}$.

6. A method according to claim 3, wherein said growing step includes forming both of said semiconductor layers by selectively growing a non-doped silicon layer.

7. A method according to claim 3, wherein the step of diffusion of impurities includes a step of rapid annealing at 800° C. to 1200° C. within 10 minutes of forming said first and second solid diffusion source layers into said semiconductor layers.

* * * * *